United States Patent [19]

Glaser

[11] Patent Number: 5,208,281
[45] Date of Patent: May 4, 1993

[54] STABILIZATION OF THIOLENE COMPOSITIONS

[75] Inventor: David M. Glaser, New Britain, Conn.

[73] Assignee: Loctite Corporation, Hartford, Conn.

[21] Appl. No.: 746,649

[22] Filed: Aug. 16, 1991

Related U.S. Application Data

[63] Continuation-in-part of Ser. No. 651,271, Feb. 5, 1991.

[51] Int. Cl.$^5$ ............................ C08K 5/22; C08K 3/00
[52] U.S. Cl. ....................................... 524/189; 524/80; 524/202; 524/260; 524/438
[58] Field of Search ................ 524/189, 202, 260, 80, 524/438

[56] References Cited

U.S. PATENT DOCUMENTS

| | | | |
|---|---|---|---|
| 3,582,521 | 6/1971 | Villa | 260/45.75 K |
| 3,661,744 | 5/1972 | Kehr | 522/24 |
| 4,119,617 | 10/1978 | Hanyuda et al. | 528/360 |
| 4,157,421 | 6/1979 | Schmidle et al. | 428/149 |
| 4,230,740 | 10/1980 | Moyer | 427/54.1 |
| 4,808,638 | 2/1989 | Steinkraus | 522/24 |
| 5,021,512 | 6/1991 | Woods et al. | 522/33 |
| 5,034,490 | 7/1991 | Jacobine et al. | 528/30 |

FOREIGN PATENT DOCUMENTS 0289852 11/1988 European Pat. Off.
338616 10/1989
1528031 9/1975 United Kingdom

OTHER PUBLICATIONS

Derwent Abstract JP 40-053944.
"Thiol-Olefin Cooxidation TOCO Reaction . . . " by Valerian T. D'Souza et al from J. Org. Chem 1987, 52, 1729-1740.
"Oxidation Addition of Mercaptans To Olefins In the Presence of A Halide" by Bredereck, H.; A. Wagner, translated from Germany by Scientific Translation Services.
"Dilatometric Studies of the Behavior of Some Inhibitors . . . " by Paul Bartlett and Harold Kwart, Journal of Am Chemical Society Mar. 23, 1950, vol. 72, No. 3.
Die Makromolekulare Chemie 97 (1966) 258-266 (No. 2156).
"Organic Sulfur Compounds XIX" by Alexis A. Oswald et al.

*Primary Examiner*—Paul R. Michl
*Assistant Examiner*—Tae H. Yoon
*Attorney, Agent, or Firm*—Vidas, Arrett & Steinkraus

[57] ABSTRACT

A combination of free radical retarding agent and an active iodine species selected from the group consisting of molecular iodine, iodide ion, and mixtures thereof provides synergistic stabilization of thiol-ene compositions which cure by addition of thiol groups to olefinic carbon-carbon double bonds. The combination is particularly suitable for thiol-ene formulations employing norbornenyl functional polyenes. A preferred stabilization system employs an N-nitrosoarylhydroxylamine salt and a mixture of an alkali iodide and $I_2$ in the range of 0.6-1 mole $I_2$ per equivalent $I^\ominus$.

18 Claims, 2 Drawing Sheets

STABILIZATION OF THIOLENE COMPOSITIONS

CROSS-REFERENCE TO RELATED INVENTION

This application is a continuation-in-part of copending application Ser. No. 07/651,271 filed Feb. 5, 1991.

BACKGROUND OF THE INVENTION

Field of the Invention

The present invention pertains to an improved stabilization system for curable thiol-ene formulations which incorporates a polyiodide stabilizer.

Definitions

As used herein:

A polyene is a compound having a plurality of olefinically unsaturated groups.

A polythiol is a compound having plurality of organic thiol groups.

A thiol-ene composition is a mixture of a polyene and a polythiol formulated to cure at least predominately by addition of thiol groups across the olefinic double bond of the polyene. Generally the composition will include a free radical initiator such as a peroxy compound or a free radical photoinitiator to initiate the thiol-ene addition reactions.

Norbornenyl groups, as used herein, are broadly defined to encompass organic functional groups of the formula:

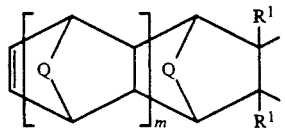

where Q is $CR_2^1$, O, S, $NR^1$ or $SO_2$, $R^1$ is H or alkyl; and m is 0-10. Thus the term should be understood to encompass, in addition to true norbornenyl groups, various substituted analogs, nadic groups and various other cyclopentadiene Diels-Alder polyadducts.

Background Art

Prior art use of iodide ion or molecular iodine in polymerizations and in polymer formulations presents an ambiguous picture as to the function and mechanism of these species.

In thiol-olefin cooxidation reactions it has been reported that chloride ion and bromide ion shortened an initial slow oxygen-absorbing phase while iodide ion prolonged the initial phase and decreased its rate. Bredereck et al, *Chemische Berichte*, 93 2415-2423 (1960); D'Souza et al, *J. Org. Chem.* 1987, 41, 1729-1740. Several hypotheses are offered in the latter reference as possible explanations of the difference between chloride/bromide and iodide in this reaction, but no conclusions are drawn as to which of the hypotheses are correct.

Organohalo compounds, such as tris(2,3-dibromopropyl) phosphate and tetrabromophthalic anhydride (0.1-10%) in combination with mercaptans (0.05-5%) are said to improve melt spin properties of polyolefin compounds. *Chem. Abst.*, 80: 1222322 (abstracting JP 48004374).

The polymerization of methacrylate ester monomers during neutralization, washing and/or extraction with base is reported to be inhibited by adding 0.03-0.3% $NaNO_2$ and/or KI to the solutions. *Chem. Abst.*, 106; 156990r (abstracting CS 229529).

Heat stability of a nylon to polymer containing a copper stearate, KI, and 2-mercaptobenzimidazole is reported to be improved over comparable formulations omitting either the KI or the mercapto compound in *Chem. Abst.*, 81: 137494 f (abstracting JP 49053944).

Halogen containing compounds such as 2,4-bis(trichloromethyl)-6-methyl-s-triazine are reported as components of an initiator system, which also uses an organic thiol component, for anaerobically curing formulations in *Chem. Abst.*, 100: 69316 h (abstracting U.S. Pat. No. 4,413,108).

In Bartlett et al, *JACS*, 72, 1051-1059 (1950), iodine was reported to have a dual effect on peroxide catalyzed polymerizations of vinyl acetate, rapidly accelerating polymerization at moderate concentrations but behaving as a rather strong inhibitor at low concentrations. $I_3$-radical is postulated as a terminator of growing polymer chain to explain the inhibition affection. A polar mechanism is postulated to explain the acceleration at higher concentrations.

Thiol-ene formulations are known from Oswald, *Die Macromolekulare Chemie*, 97, 258-266 (1966); U.S. Pat. Nos. 3,661,744; and 4,119,617. In general, such formulations are mixtures of polythiol and polyene compounds which are cured by radical reaction to form a polythiol ether. Acid catalyzed cure is also described in the literature. The principle cure mechanism of interest for commercial products, however, has been the photoinitiated free radical cure mechanism.

Conventional free-radical stabilizers, such as hydroquinone, phenothiazine and the like, are commonly used as stabilizers for such thiol-ene formulations but it has long been recognized that such stabilizers often are not effective for providing a thiol-ene formulation with a commercially acceptable shelflife. Even with careful packaging to exclude any light, thiol-ene formulations often polymerize in their package within a few weeks of manufacture.

This problem has been particularly acute with formulations in which the ene functionality of the polyene is a norbornenyl functionality such as described in U.S. Pat. No. 4,808,638. Such compositions are highly attractive for a variety of applications because of their exceptionally rapid photocure speeds and the wide variety of cured product profiles available to the formulator. Ambient temperature stability of photocurable compositions formulated from such materials has been so poor that commercialization has heretofore produced impossible despite several years of intensive development work directed to the commercialization thereof.

In co-pending application Ser. No. 07/612,759, claiming priority of Ireland application, 3638/89, it is disclosed that certain N-nitrosohydroxyl amines and salts thereof are much superior stabilizers for radically curable norbornenyl/thiol formulations. However, this stabilizer by itself has still proven inadequate to allow for the reliable commercial scale production of thiol-ene formulations based on norbornenyl enes having commercially practical dark ambient shelf-lives. There exists, therefore, a need for an improved stabilizer system for thiol-ene formulations.

SUMMARY OF THE INVENTION

The invention comprises in one aspect a radically curable thiol-ene formulation comprising a mixture of a polyene, a polythiol and a free radical retarding agent, which further comprises a stabilizing effective amount of an active iodine species selected from the group consisting of iodide, iodine and mixtures thereof. In a further aspect, the invention comprises such a formulation in which the polyene is a compound having a plurality of norbornenyl functional groups thereon.

In another aspect the invention is a formulation as described in which the free radical retarding agent is a hydroxylamine compound or salt, most preferably a metal salt of an N-nitrosoarylhydroxylamine.

DETAILED DESCRIPTION OF THE INVENTION

Figure 1:
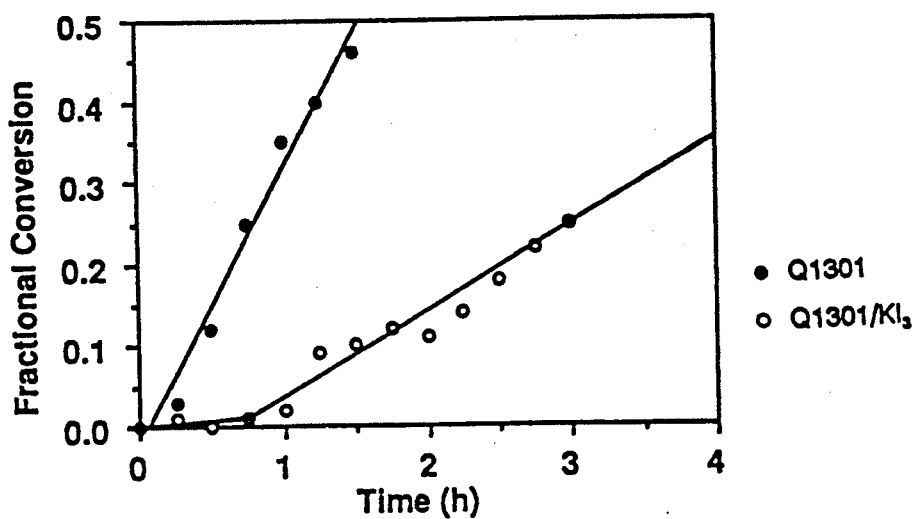
FIG. 1 is a graph showing fractional conversion to polymer versus time of a thiol-ene formulation of the invention and of comparable formulation without active iodine species, at 110° C.

The present invention derives from the unexpected discovery that measurements of active oxygen (i.e. peroxide species) in norbornenyl resins by oxidation of $I_3^\ominus$ to $I_2$ produced negative active oxygen numbers. This result suggested that the samples were interfering with the oxidation or were consuming $I_2$ in a side reaction, and led to the investigation of polyiodide species as stabilizers for thiol-ene formulations.

The combination of active iodine species and a free radical retarding agent displays a true synergistic effect, providing a stabilization which is more than the sum of the stabilization effects of the polyiodide and the radical inhibitor alone.

The synergistic effect is also apparent in the photocuring of thiol-ene formulations of the invention where an induction period is evident. This induction period is believed to be unique to the inventive formulations. In photoinitiated polymerizations various compounds are known which will inhibit polymerization by slowing the rate of polymerization and often resulting in lower monomer to polymer conversion. However, it is not believed that any inhibition system has been previously demonstrated which exhibits a distinct induction period during which polymer is nearly completely suppressed followed by polymerization at a rapid rate.

Extensive examples of polyenes useful in the inventive formulations are provided in U.S. Pat. Nos. 3,661,744, 4,119,617, 4,157,421, 4,808,638, and 5,021,512, all of which are incorporated herein by reference. Preferred polyenes are compounds containing a plurality of norbornene, vinyl or allylic groups.

Examples of norbornene functional compounds may be found in U.S. Pat. Nos. 4,808,638, 5,034,490, in co-pending U.S. application Ser. No. 07/619,068 filed Nov. 28, 1990, and in copending application U.S. application Ser. No. 07/651,271 filed Feb. 5, 1991, all incorporated herein by reference. Preferred norbornene compounds are those which include groups of the formula:

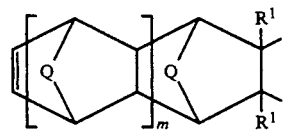

in which Q is $CH_2$, m is 0 and the $R^1$ groups are independently H or methyl, especially compounds having a plurality of groups of the formula

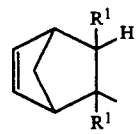

where $R^1$ is H or methyl. Particularly preferred norbornene compounds are norbornene carboxylate esters of polyols such as 1,6-hexanediol, trimethylolpropane, ethoxylated bisphenol A, and mixtures thereof.

The polythiol component of the inventive compositions may be any compound having two or more thiol groups per molecule. Suitable polythiols are described in U.S. Pat. No. 3,661,744 at Col. 8, line 76–Col. 9, line 46; in U.S. Pat. No. 4,119,617, Col. 7, lines 40–57; U.S. Pat. Nos. 3,445,419; and 4,289,867. Especially preferred are polythiols obtained by esterification of a polyol with an α or β-mercaptocarboxylic acid such as thioglycolic acid, or β-mercaptopropionic acid. Particularly preferred polythiols are pentaerythritol tetramercaptoacetate and pentaerythritol tetrakis-β-mercaptopropionate (PETMP).

The ratio of the polyene to the polythiol component can be varied widely. Generally it is preferred that the ratio of thiol to ene groups be between 0.7:1 and 1.3:1, more preferably about 1:1, but ratios outside this range may occasionally be usefully employed without departing from the invention hereof.

While a curable composition using compounds of the invention may include both difunctional ene compounds and difunctional thiol compounds, it will be understood that at least a portion of at least one of these components should contain more than two functional groups per molecule to produce a crosslinked product when cured. That is, the total of the average number of ene groups per molecule of polyene and the average number of coreactive thiol groups per molecule of the polythiol should be greater than 4 when a crosslinked cured product is desired. This total is referred to as the "total reactive functionality" of the composition.

The free radical retarding agent component of the formulation is suitably a hydroxylamine compound or salt, most suitably an N-nitrosoarylhydroxylamine or complex salt thereof. Illustrative examples being the ammonium, sodium, potassium, magnesium, strontium, aluminum, copper, zinc, cerium, iron, nickel and cobalt salts of N-nitrosophenylhydroxylamine. The aluminum salt of N-nitrosophenylhydroxylamine, sold under the tradename Q1301, is preferred. Suitable levels of such inhibitors are between about 50 ppm and 2%, preferably 500–10,000 ppm. Other free radical retarding agent may also be useful in the invention, such as sulfur, phenothiazine, hydroquinone, butylated hydroxy toluene and the like, at levels of between about 0.5% and 5%.

The active iodine species is selected from molecular iodine, an iodide, or mixtures thereof. Experimental results show that addition of iodide ($I^{\ominus}$) alone or molecular iodine ($I_2$) alone are effective in the inventive formulations although at somewhat reduced activity compared to the addition of both $I^{\ominus}$ and $I_2$. As both $I^{\ominus}$ and $I_2$ can theoretically form $I_3^{\ominus}$ in-situ in the formulations, the active species in the inventive formulations is believed to be the triiodide ion in all cases. However, because $I_3^{\ominus}$ cannot be readily isolated, the applicant does not wish to be bound by this theory.

For purposes of determining concentrations of the active iodine species the sum of the starting $I^{\ominus}$ and $I_2$ components may be used. In general, the active iodine species should be present in an amount to provide between about 1.0 and 1000 ppm, preferably between 30 and 500 ppm of $I_2$, $I^{\ominus}$ or mixtures thereof. Higher levels up to 5000 ppm may be required for formulations employing just $I^{\ominus}$. Preferably the active iodine species is a mixture of $I_2$ and $I^{\ominus}$ providing between about 0.6 and 1 mole of $I_2$ for each equivalent of $I^{\ominus}$. Conveniently, the $I^{\ominus}$ species is provided in the form of an alkali metal iodide, an organic phosphonium iodide or hydrogen iodide. For ease of introduction into the formulation, the iodide and iodine may be premixed in a suitable solvent such as water or ethanol.

A free radical initiator is recommended in the curable thiolene formulations, suitably a free radical photoinitiator or thermal initiator. Examples of free radical photoinitiators include benzoin and substituted benzoin compounds, benzophenone, Michler's ketone dialkoxybenzophenones, dialkoxyacetophenones, peroxyesters described in U.S. Pat. Nos. 4,616,826 and 4,604,295, etc. The photoinitiator is employed in an amount effective for initiating cure of the formulation, typically 0.5–5%. Thermal free radical initiators such as peroxy compounds, azonitriles and the like may also be used at conventional levels as initiators of the thiol-ene addition reaction. In the case of norbornenyl based formulation, an initiator may be unnecessary to initiate rapid thermal polymerization at practical elevated temperatures.

The invention is illustrated by the following examples.

EXAMPLE 1

Screening Study to Identify Suitable Stabilizers

In order to identify materials which would be effective components of a stabilizer system for the norbornene/thiol compositions, a screening study was performed to determine the effects of known free radical inhibitors and retarding agents on the dark thermal stability of representative compositions. In this way the most effective materials for use in conjunction with triiodides and related materials could be identified and selected for a more detailed kinetic analysis.

The study was carried out by measuring the gelation time of compositions containing different concentrations of various stabilizers at 80° C. Samples were prepared by blending together the norbornene and thiol comonomers with photoinitiator and stabilizer as listed below. Aliquots (approximately 1.5 g) of each formulation were placed in small test tubes, swept with nitrogen, sealed and placed in a thermostatically controlled heating block at 80° C. Care was taken to ensure that the tubes were not more than half full with liquid composition. Each sample was covered to ensure that no light penetrated the sample.

The samples were periodically checked by removing from the block, inverting and observing for signs of gelation. If liquid flow did not commence directly following inversion, the sample was considered to have gelled. The time taken to produce gelled polymer under these conditions was measured. The testing frequency generally decreased as the reaction time or stability of the composition increased. Initial observations were made after 3, 6, 12, 20, and 60 minutes; thereafter each hour for the next 6 hours and finally on a daily basis unless otherwise indicated in the table of results below.

Compositions based on two different norbornene monomers were prepared: bis-2,2-(4-(2-(norborn-2-ene-5-carboxy)ethoxy)phenyl) propane (ethoxylated bisphenol A di-norbornenecarboxylate, EBPA-DN) and hexanediol di-norbornecarboxylate (HDDN), the reaction product of 1,6-hexanediol diacrylate and cyclopropionate) (PETMP). The thiol used was pentaerythritol tetra-(3-mercaptoproprionate) (PETMP). A commercially avialable photoinitiator, Darocure TM 1173 (supplied by EM Industries Inc.) was also included in the formulation. The basic formulation details are as follows (amounts are indicated in weight %):

| 1. | HDDN | 58 |
|---|---|---|
|    | PETMP | 40 |
|    | Darocure TM 1173 | 2 |
| 2. | EBPA-DN | 73 |
|    | PETMP | 25 |
|    | Darocure TM 1173 | 2 |

The amounts of comonomers used in these formulations correspond to a 1:1 ratio based on functional group equivalents. Using these proportions of basic ingredients test compositions were prepared by first dissolving the stabilizer(s) in the Darocure TM 1173 or the Darocure TM 1173/PETMP blend followed by addition of the norbornene monomer. Details of the test compositions and associated 80° C. gel times are shown in the following table:

TABLE I

| Basic Composition | Stabilizer | Concentration (ppm) | Gel Time (hours) |
|---|---|---|---|
| HDDN | none | 0 | 0.05 |
| HDDN | phenothiazine | 260 | 0.30 |
| HDDN | potassium triiodide | 1,000 | 4 |
| EBPA-DN | sulfur | 500 | *32 |
| EBPA-DN | sulfur | 5,000 | *261 |
| HDDN | aluminum N-nitrosophenylhydroxylamine (Q1301) | 1,000 | 102 |
| HDDN | Q1301 | 500 | 99 |
| EBPA-DN | Q1301 | 1,000 | 56 |
| HDDN | Q1301 t-butylcatechol | 500 500 | 67 |
| HDDN | Q1301 T-butylcatechol | 500 200 | 83 |
| HDDN | CGL-123 (hindered amino-ether, Ciba Geigy) | 10,000 | 0.1 |
| HDDN | CGL-123 Q1301 | 10,000 500 | 24 |
| HDDN | phenothiazine Q1301 | 260 500 | 87 |
| HDDN | diethylhydroxylamine t-butylcatechol | 500 500 | 67 |
| EBPA-DN | Q1301 triallylphosphite | 1,000 6,000 | <41 |

*These samples were tested under an air atmosphere.

All of the stabilizers examined showed some measure of improved stability over the basic composition which did not contain any stabilizer. Nevertheless, to be useful for norbornene/thiol stability it was considered necessary to have an 80° C. gel time in excess of 24 hours. It was surprising that phenothiazine, known to be an efficient inhibitor of free radical polymerization, had very little effect on the stability of the thiol/norbornene composition. Likewise the hindered amino ether, CGL-123, known to be a free radical scavenger, produced almost no measurable improvement in the product stability.

Of the stabilizers examined, the aluminum complex of N-nitrosophenylhydroxylamine, diethylhydroxylamine and elemental sulfur appear to be the most efficient. Combinations of the hydroxylamine derivatives with known radical stabilizers, phenothiazine, CGL-123 and t-butylcatechol gave compositions with acceptable stability, but the effect was antagonistic rather than synergistic.

EXAMPLE 2

Thermal Cure of Norbornene/Thiol Compositions Containing Q1301 and Potassium Triiodide Norbornene/thiol compositions were prepared as described in Example 1 for both HDDN and EBPA-DN. Each monomer blend was formulated with two different stabilizer systems:

(1) 1000 ppm Q1301; and
(2) 1000 ppm each of Q1301 and potassium triiodide ($KI_3$). Aliquots of each composition were placed in glass test tubes, as described in Example 1, and aged in thermostatically controlled heating blocks at several different temperatures.

Periodically each sample was stirred and a small portion removed and analyzed by Fourier Transform Infrared Spectroscopy (FTIR). The infrared (IR) spectrum of the norbornene/thiol compositions shows an intense, isolated absorption band at approximately 715 cm$^{-1}$, characteristic of a cis-alkene, in this case the norbornene monomer. As the polymerization reaction proceeds, the absorbance of this band decreases in relation to the residual concentration of monomer, disappearing on complete consumption. By measuring the absorbance of this band relative to its absorbance at zero time, i.e., directly following formulation and before heating, the residual concentration of the norbornene monomer may be determined from the ratio of the two absorbance values, $A_1/A_0$, where $A_1$=absorbance after some time interval and $A_0$=absorbance at time zero. This method for quantitative analysis is well known and is described in more detail in many textbooks on infrared spectroscopy (e.g. R. T. Conley, *Infrared Spectroscopy*, 2nd Edition, pp. 221-235, Allyn and Bacon, Inc., Boston, 1972). At 110° C., the conversion of norbornene monomer with time, in the HDDN composition, is shown graphically in FIG. 1 for both stabilizer systems.

It is readily apparent from FIG. 1 that there is a significant difference in both the mode and extent of cure of the two systems:

Firstly, the N-nitrosophenylhydroxylamine aluminum complex, Q1301, acting alone functions only as a retarding agent; i.e., it does not prevent polymerization or curing from taking place, but simply slows the rate at which this occurs (compared to formulation without stabilizer in Example 1). In contrast, the composition containing both Q1301 and KI$_3$ shows a significant induction period during which time little or no polymerization occurs. In this case the stabilizer system functions to temporarily stop, not just retard, the polymerization.

Secondly, once the polymerization commences in the case of the Q1301/KI$_3$ stabilizer system, the reaction proceeds at a rate which is slower than that observed for the product containing the Q1301 alone.

This result is surprising, particularly as the screening study (Example 1) indicated that KI$_3$ acting alone does not function as an efficient stabilizer. The combination of Q1301 and KI$_3$ is clearly synergistic.

The induction period measured from FIG. 1 for the composition containing Q1301/KI$_3$ is 0.6 hours. The experiment was at 65° C. for both compositions and although the overall rates of polymerization were reduced, the same behavior was observed: the composition containing only Q1301 showed no induction period, whereas the composition containing both Q1301 and KI$_3$ exhibited a distinct induction period of 26 hours.

The analysis was repeated using the compositions containing EBPA-DN as the norbornene comonomer. At 95° C. the conversion times were as shown in FIG. 2.

Figure 2:
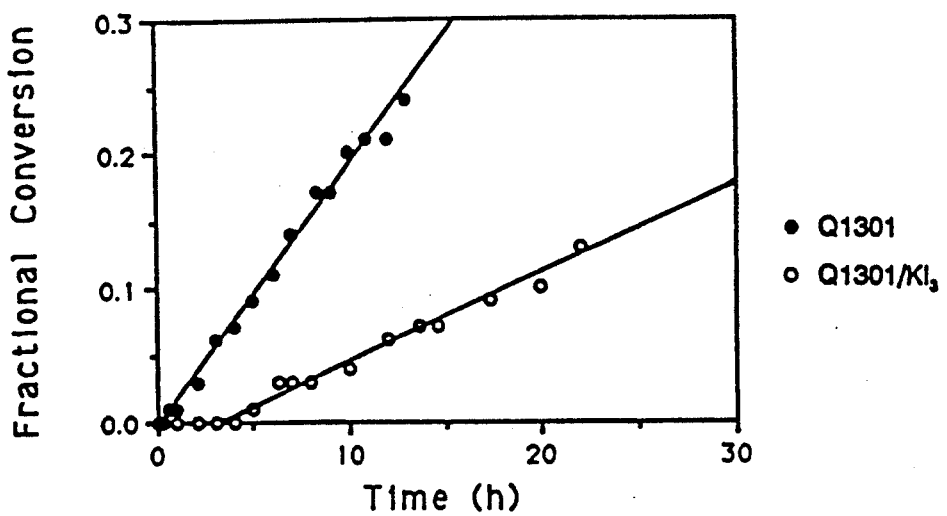
FIG. 2 is a graph as in FIG. 1 using a different formulation at 95° C.

The graphical form data presented in FIG. 2 clearly shows the induction period of the formulation containing both Q1301 and KI$_3$, whereas the product containing only Q1301 shows no induction period.

The induction time measured from this graph, for the composition containing both components of the stabilizer system, is estimated to be in the region of 3 hours.

A similar experiment was conducted at 80° C. The overall reaction rates were slower, but the same behavior was observed: the composition containing Q1301 only showed no induction period; whereas the material with both stabilizers showed a distinct induction period of approximately 6 hours.

EXAMPLE 3

The Effect of Q1301 and KI$_3$ on the Photocuring Sensitivity

Figure 3:
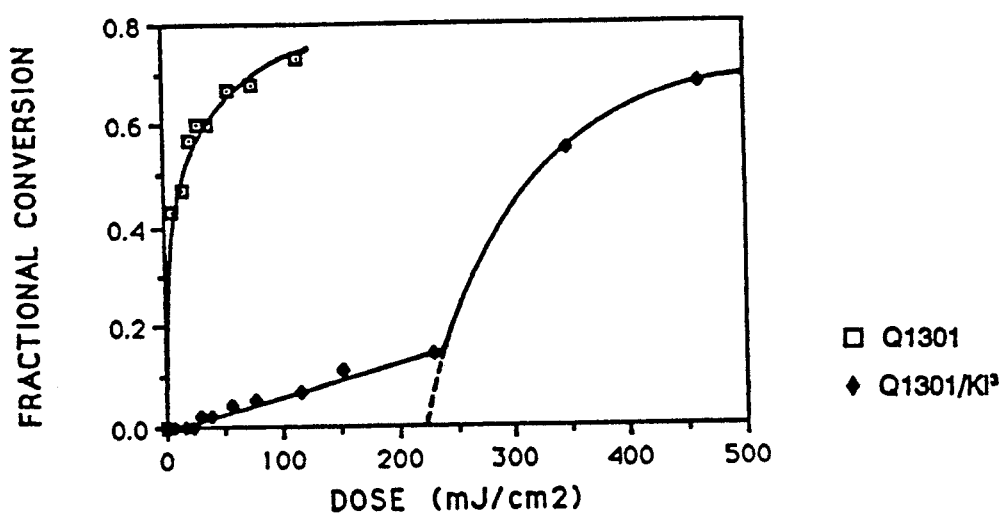
FIG. 3 is a graph showing fractional conversion to polymer versus radiation dosage of two irradiated formulations, one with and one without an active iodine species component.

To measure the effects of the stabilizers on the photosensitivity of norbornene/thiol compositions, thin films of the HDDN formulations described in Example 2 were prepared on potassium bromide IR discs and irradiated with a predetermined dose of ultraviolet (UV) light from a 100 W mercury lamp (Blak-Ray, supplied by UVP Inc.), through a 365 nm narrow band pass filter, at an incident light intensity of 3.85 mW/cm$^2$. After each exposure, the conversion of norbornene monomer was determined by FTIR spectroscopy in the same manner as described in Example 2. The results obtained are shown in graphical presentation in FIG. 3. It can be clearly seen from FIG. 3 that there is a significant difference in the photocuring response of the two compositions.

For the composition containing Q1301 only, polymerization proceeds rapidly at relatively low doses of UV radiation requiring only 35 mJ/cm$^2$ to achieve a conversion of 0.6. After this point is reached the rate begins to drop off significantly. In contrast, the composition containing both Q1301 and KI$_3$ shows little or no cure until the accumulated dose exceeds 200 mJ/cm$^2$. After this point is reached, the polymerization rate increases to a value which almost matches that of the composition containing only the Q1301. In this case the dose required to achieve a conversion of 0.6, is 380 mJ/cm$^2$.

The active iodine component functions to impose an energy threshold on the curing of the composition. From FIG. 3 this value is estimated by extrapolation to be in the region of 220 mJ/cm$^2$. Having exceeded this energy value, the polymerization may proceed at more or less the same rate as an equivalent composition which does not contain $KI_3$.

EXAMPLE 4-7

Formulations

Example 4—Control 0.8258 Grams Aluminum N-nitrosophenylhydroxylamine (Q1301) and 16.5 grams Darocure TM 1173 photoinitiator were mixed for one hour in the dark and under nitrogen. The resultant solution, designated premix 4, had completely dissolved the Q1301.

A control thiolene formulation was prepared to determine base line stability of the EBPA-DN/PETMP system without active iodine treatment. The formulation was made by mixing 565.7 grams of EBPA-DN with 16.46 grams of premix 4, then mixing in 218 grams of PETMP under a nitrogen atmosphere for one hour. The resultant formulation had 2% w/w photoinitiator (Darocure TM 1173, EM Industries, Hawthorne, N.Y.) and 993 ppm Q1301 based on the amount of norbornene and thiol monomer.

Three 50 gm samples of the resulting control formulation and two 100 gm samples were each stored in amber glass bottles under a nitrogen atmosphere. The 50 gm samples were used to determine viscosity of the formulation at 7 days, 28 days, and 90 days when the composition was stored at room temperature. One of the two 100 gm samples was used to determine 180 day stability room temperature. The second 100 gm sample was used to determine 180 day stability when refrigerated at 3°-9° C.

Example 5—With $I^e$ and $I_2$ 500 grams of EBPA-DN 2.06 ml of an aqueous solution of 126.92 mg iodine and 63.46 mg potassium iodide per milliliter water were placed in a 1 liter round-bottom flask equipped with a mechanical stirrer, air condenser, thermometer and nitrogen blanket. The mixture, designated premix 5A, was heated to 50°-65° C. for 30 minutes and then allowed to sit overnight.

0.689 grams Q1301 and 13.77 grams Darocure TM 1173 were mixed for one hour in the dark and under nitrogen. The resultant solution, designated premix 5B, had completely dissolved the Q1301.

The formulation was prepared by mixing 407.9 grams of premix 5A and all of premix 5B for twenty minutes under nitrogen. Then 142 grams of PETMP were added and mixed for an additional one hour under nitrogen. The resultant formulation contained 2% w/w. Darocure TM 1173 photoinitiator and 1,001 ppm Q1301 based on the amount of norbornene and thiol monomer. The formulation was then divided and stored as with the Example 4 control.

EXAMPLE 6—With KI 500 grams of EBPA-DN and 2.09 ml of an aqueous solution of 1.052 grams potassium iodide per milliliter water were placed in a 1 liter round bottom flask equipped with a mechanical stirrer, air condenser, thermometer and nitrogen blanket. The mixture, designated premix 6A, was heated to 55° C. for one hour and then allowed to sit over night.

0.689 grams N-nitrosophenylhydroxylamine aluminum salt (Q1301) and 13.77 grams Darocure TM 1173 were mixed for one hour in the dark and under nitrogen. The resultant solution, designated premix 6B, had completely dissolved the Q1301.

A thiolene formulation of the invention was prepared by mixing 407.9 grams of premix 6A and all of premix 6B for 30 minutes under nitrogen. The 142.1 grams of PETMP was added and mixed for an additional 1 hour under nitrogen. The resultant formulation had 2.0 Wt % Darocure TM 1173, 1,000 ppm Q1301, and 3,261 ppm potassium iodide based on the amount of norbornene and thiol monomer.

Samples were prepared for storage as described above for Example 4.

EXAMPLE 7—With $I_2$ 500 grams of EBPA-DN and 0.261 grams iodine were placed in a 1 liter round bottom flask equipped with a mechanical stirrer, air condenser, thermometer and nitrogen blanket. The mixture, designated premix 7A, was stirred for 12 hours at room temperature.

0.689 grams N-nitrosophenylhydroxylamine aluminum salt (Q1301) and 13.75 grams Darocure TM 1173 were mixed for one hour in the dark and under nitrogen. The resultant solution, designated premix 7B, had completely dissolved the Q1301.

Formulation 7 was prepared by mixing 407.9 grams of premix 7A and all of premix 7B for 20 minutes under nitrogen. Then 142 grams of PETMP were added and mixed for an additional two hours under nitrogen. The resultant formulation had 2 Wt % Darocure TM 1173, 1,000 ppm Q1301, and 387 ppm iodine based on the amount of norbornene and thiol monomer. The formulation was divided in a number of containers and prepared for storage as described above.

RESULTS

The results of the shelf life stability tests are given in Table II, below.

TABLE II

| Example | Starting Viscosity | Day 7 25° | Day 28 25° | Day 90 25° | Day 180 25° | Day 180 3-9° C. |
|---|---|---|---|---|---|---|
| 4 | 7204 | 53520 | 69865 | 92660 | 104348 | 33213 |
| 5 | 7417 | 7053 | 8962 | 18813 | 15515 | 8340 |
| 6 | 7433 | 9266 | 14810 | 27060 | 34891 | 9695 |
| 7 | 11700 | 14485 | 16761 | 36697 | 26496 | 9577 |

The criteria used to determine a commercially acceptable level of viscosity change for these formulations was a doubling of the starting viscosity (a 100% increase) which corresponds to a 5.6% conversion of the ene functional group. Gellation of the formulation occurs at greater than 50% conversion of the ene functional group, which is well past what is considered a usable formulation. As can be seen from Table II, the control had an acceptable room temperature shelf life of less than 7 days whereas the formulations of examples 5-7 which included polyiodide all had acceptable room temperature shelf lives of at least 28 days and under refrigeration remained acceptable at 180 days.

EXAMPLE 8

A thiolene control formulation was prepared as follows:

| | Parts by Weight |
|---|---|
| triallyltriazinetrione (TTAT) | 202.4 |
| pentaerythritol tetra-(3-mercaptoproprionate) (PETMP) | 297.6 |

| | Parts by Weight |
|---|---|
| photoinitiator/inhibitor premix | 10.5 |

The photoinitiator/inhibitor premix was prepared by mixing Darocure ™ 1173 photoinitiator with Q1301 at a weight ratio of 12.5/0.625. The resulting control formulation had a Q1301 concentration of 1000 ppm.

A second formulation was prepared which was identical to the control except that 0.25 parts by weight of a commercial 1N $KI_3$ solution (Fisher Scientific) was added, thereby providing a $KI_3$ concentration of 500 ppm (302 ppm $I_2$, 198 ppm KI).

The viscosities of the control and invention formulations were periodically monitored, as in Examples 4–7. The results, given below, show that the addition of the polyiodide stabilizer significantly improved the storage stability of the formulation.

| Formulation | Starting Viscosity | Day 7 25° C. | Day 28 25° C. |
|---|---|---|---|
| Control | 363 cps | 404 cps | 627 cps |
| Control + 500 ppm $KI_3$ | 312 cps | 320 cps | 303 cps |

EXAMPLE 9

A control formulation was prepared as follows:

| | Parts By Weight |
|---|---|
| Norbornenemethyl norbornene carboxylate | 200 |
| pentaerythritol tetra-(3-mercaptoproprionate) (PETMP) | 200 |
| photoinitiator/inhibitor premix* | 8.4 |

*same as Example 8

A formulation of the invention was prepared by adding an amount of an aqueous solution, 1N in $I_2$ and 0.76N in KI, to an identically prepared formulation to provide an $I_2$ level of 254 ppm and a KI level of 127 ppm.

Shelf stability studies, as in Examples 5 and 8, again show very substantial improvement in the shelf life of the inventive formulation over that of the control:

| Formulation | Starting Viscosity | Day 7 25° C. | Day 28 25° C. | Day 90 25° C. | Day 180 25° C. |
|---|---|---|---|---|---|
| Control | 276 | 8,098 | 16,650 | 47,100 | 105,800 |
| Control + $I^\ominus/I_2$ | 145 | 352 | 1,573 | 5,079 | 40,162 |

While the foregoing examples herein serve to illustrate the invention, they should be considered non-limiting as those skill in the art will understand that numerous other formulations may be prepared without departing from the invention hereof.

What is claimed is:

1. In a curable thiol-ene formulation comprising a polythiol, a polyene and a free radical retarding agent the improvement comprising that the free radical retarding agent is a N-nitrosoarylhydroxylamine or salt thereof and the formulation includes a stabilizing effective amount of an active iodine species selected from the group consisting of $I^\ominus$, $I_2$ and mixtures thereof.

2. A formulation as in claim 1 wherein the free radical retarding agent is a salt selected from the group consisting of ammonium, sodium, potassium, magnesium, strontium, aluminum, copper, zinc, cerium, iron, nickel and cobalt salts of an N-nitrosoarylhydroxylamine.

3. A formulation as in claim 1 wherein the free radical retarding agent is the aluminum salt of N-nitrosophenylhydroxylamine.

4. A formulation as in claim 1 wherein the active iodine species comprises a mixture of $I_2$ and an iodide selected from the group consisting of alkali metal iodides, organic phosphonium iodides and hydrogen iodide.

5. A formulation as in claim 4 wherein $I_2$ is present at a level of between 0.6 and 1 mole $I_2$ per equivalent of $I^\ominus$.

6. A formulation as in claim 4 wherein the active iodine species is present at a level of between 10 and 1000 ppm.

7. A formulation as in claim 4 wherein the active iodine species is present at a level of between 30 and 500 ppm.

8. A composition as in claim 1 wherein the polyene is a compound having a plurality of norbornenyl groups thereon.

9. A composition as in claim 8 wherein said norbornenyl groups have the formula:

wherein the $R^1$ groups are independently H or alkyl.

10. A composition as in claim 9 wherein the polyene is a norbornene carboxylate ester of a polyol.

11. A composition as in claim 9 wherein the polyene is a polyorganosiloxane having plural norbornenyl groups.

12. A composition as in claim 1 wherein the ratio of polyene to polythiol is between about 0.7:1 and 1.3:1, on an equivalents basis.

13. A composition as in claim 1 wherein the active iodine species is $I_2$.

14. A composition as in claim 1 wherein the active iodine species is $I^\ominus$.

15. A composition as in claim 1 further comprising a free radical initiator.

16. A composition as in claim 15 wherein the initiator is a photoinitiator.

17. A composition comprising
   (a) a polythiol,
   (b) a polyene,
   the ratio of polyene to polythiol being between about 0.7:1 and 1.3:1 on an equivalents basis,
   (c) a metal salt of an N-nitrosoarylhydroxylamine at a level of between 50 ppm and 2%, and
   (d) between 1 and 5000 ppm of an active iodine species selected from the group consisting of $I_2$, $I^\ominus$ and mixtures thereof.

18. A composition as in claim 17 wherein the polyene is a plural norbornenyl compound, the polyene and polythiol are present at a ratio of about 1:1 on an equivalents basis, the N-nitrosoarylhydroxylamine salt is the aluminum salt of N-nitrosophenylhydroxylamine and is present at a level of 500–10,000 ppm and the active iodine species is a mixture of $I_2$ and $I^\ominus$ at a ratio of 0.1–1 mole $I_2$ per equivalent of $I^\ominus$.

* * * * *